United States Patent [19]
Fan et al.

[11] Patent Number: 5,747,378
[45] Date of Patent: May 5, 1998

[54] METHOD OF DAMAGE FREE DOPING FOR FORMING A DRAM MEMORY CELL

[75] Inventors: Der-Tsyr Fan, Tanshui; Chon-Shin Jou, Tainan; Ting-S. Wang, Hsinchu, all of Taiwan

[73] Assignee: Mosel Vitelic Inc., Hsinchu, Taiwan

[21] Appl. No.: 863,402

[22] Filed: May 27, 1997

[51] Int. Cl.$^6$ .................................. H01L 21/22
[52] U.S. Cl. ............... 438/563; 438/303; 148/DIG. 144
[58] Field of Search ........................ 438/563, 303, 438/305–306; 148/DIG. 14 C

[56] References Cited

U.S. PATENT DOCUMENTS 4,486,943 12/1984 Ryden et al. .......................... 438/303
5,482,876 1/1996 Hsieh et al. .......................... 438/303
5,599,734 2/1997 Byun et al. .......................... 438/563

*Primary Examiner*—Jey Tsai
*Attorney, Agent, or Firm*—Cushman, Darby & Cushman IP Group of Pillsbury Madison & Sutro LLP

[57] ABSTRACT

A method of damage-free doping for forming a dynamic random access memory cell is disclosed herein. A phosphoric silicate glass is deposited as a diffusion source. The phosphorous ions of phosphoric silicate glass can be diffused into a substrate to form the source/drain regions by a high temperature during a thermal annealing process. Next, a thermal oxide layer is formed on the gate electrode and the surface of the substrate by the thermal oxidation process. The thermal oxide layer can prevent ions from diffusing into the substrate during the subsequent thermal treatment process. Therefore, the present invention can reduce the damage of a dynamic random access memory.

19 Claims, 9 Drawing Sheets

METHOD OF DAMAGE FREE DOPING FOR FORMING A DRAM MEMORY CELL

BACKGROUND OF THE INVENTION

1. Field of the Invention

The present invention relates to dynamic random access memory (DRAM) fabrication, and more particularly to a method of damage-free doping for a dynamic random access memory cell.

2. Description of the Prior Art

In a typical process of forming a dynamic random access memory (DRAM) cell, the MOS transistors are formed in periphery circuit and memory cell. The implantation of MOS transistors usually considers the implanting dosage, the impurity concentration distribution, and the leakage current. Therefore, there are two conventional methods for forming MOS transistors in the DRAM cell used as follow:

The first conventional method to form the impurity region is ion implantation. Referring to FIG. 1A, after an isolation process such as a standard LOCOS (Local Oxidation of Silicon) is performed, field oxide layers (FOX) 102 are formed on a substrate 100 to define an active area 103. A gate oxide layer 104 and a polysilicon layer 106 are sequentially formed over the substrate 100 and on the field oxide layers (FOX) 102. A photoresist 108 is patterned on the polysilicon layer 106, covering a portion of the top surface of the polysilicon layer 106 to define a gate electrode region.

Referring to FIG. 1B, an etching process is performed by using the photoresist 108 as an etching mask. The unmasked portions of the gate oxide layer 104 and the polysilicon layer 106 are etched to the surface of the substrate 100. After the etching process, a gate electrode 110 is formed. Next, the photoresist 108 is removed.

Afterwards, referring to FIG. 1C, a dielectric layer 112 is formed on the gate electrode 110 and the substrate 100.

Next, as shown in FIG. 1D, an anisotropic etching process, such as a reactive ion etch, is performed to etch the dielectric layer 112, forming the sidewall spacers 114 on the sidewalls of the gate electrode 110.

Afterwards, referring to FIG. 1E, an ion implantation having a heavier impurity concentration is performed to the substrate 100. The N+ or P+ type impurities can be used to implant into the substrate 100. Next, the ions used for the source/ drain implantation are driven into the substrate 100 to form source/drain regions 116 by a thermal treatment process. The conventional method utilizes the ion implantation to implant ions into the substrate 100. Thereafter, the ions are diffused and driven into the substrate 100 by the thermal treatment process to form the source/drain regions 116. Therefore, the conventional ion implantation method will usually cause the damage in the substrate100, and increase the leakage current. Additionally, the method of using the thermal treatment process to diffuse ions into the substrate cannot effectively control the diffusing depth of ions and the concentration distribution of ions. Therefore, the conventional method will reduce the breakdown voltage.

Another prior art method uses a phosphoric silicate glass (PSG) as a diffusion source. The ions of phosphoric silicate glass (PSG) are diffused and driven into the substrate by a thermal treatment process to form source/drain regions. Reffering FIG. 2A to FIG. 2D, they show cross-sectional views illustrative of various steps of forming a gate electrode and sidewall spaces. After an isolation process such as LOCOS, field oxide layers 202 are formed on a substrate 200 to define an active area 203. Next, a gate oxide layer 204 and a polysilicon layer 206 are sequentially deposited over the substrate 200. A photoresist 208 is patterned on the polysilicon layer 206 to define a gate electrode region. Next, portions of the gate oxide layer 204 and the polysilicon layer 206 are etched by using the photoresist 208 as an etching mask, then a gate electrode 210 is formed. After removing the photoresist 208, a dielectric layer 212 is formed on the gate electrode 210 and the substrate 200. An anisotropic etching process, such as a reactive ion etch, is performed to etch the dielectric layer 212, forming sidewall spacers 214 on the sidewalls of the gate electrode 210. Afterwards, referring to FIG. 2E, a phosphoric silicate glass (PSG) 216 is formed on the gate electrode 210 and the substrate 200 by a chemical vapor deposition process. Thereafter, a thermal treatment process is performed. The phosphorous (P) ions of the phosphoric silicate glass (PSG) 216 are diffused and driven into the substrate 200 to form source/drain regions 218. In the second conventional method, the impurity diffusion concentration is accumulated near the surface of the substrate to form the deep source/drain regions. The phosphorous (P) ions of the phosphoric silicate glass (PSG) will still continually diffuse and drive into the substrate during the subsequent thermal treatment process, for example, the annealing process or the flow process of dielectric planarization. Therefore, MOS transistors formed in periphery circuit and memory cell will generate serious problem because of junction depth increment, such as subthreshold and isolation leakages.

SUMMARY OF THE INVENTION

It is a primary object of the present invention to provide a method of damage-free doping for a dynamic random access memory cell. The method can prevent the damage in the substrate induced by the ion implantation, and prevent the leakage current form increasing.

It is another object of the present invention to provide a method of damage-free doping for a dynamic random access memory cell. In one embodiment of the present invention, it can prevent ions from diffusing into the substrate during the subsequent thermal treatment process. Therefore, the method can reduce the subthreshold and isolation leakages damage of the dynamic random access memory device.

Accordingly, the present invention provides a method of damage-free doping for forming a dynamic random access memory cell. A phosphoric silicate glass (PSG) serves as a diffusion source to diffuse and drive the phosphorous (P) ions of the phosphoric silicate glass (PSG) into the substrate by an annealing thermal treatment process. A thermal oxide layer is formed on the surface of the substrate and the gate electrode by a thermal oxidation process. The thermal oxide layer can prevent the phosphorous (P) ions of the phosphoric silicate glass (PSG) from diffusing into the substrate. Therefore, the present invention can reduce the damage and leakage of the dynamic random access memory device. The method includes the steps as follow:

After using the isolation process such as LOCOS, field oxide layers (FOX) are formed on a substrate to define an active area. A gate oxide layer is formed on the substrate. A polysilicon layer is formed on the gate oxide layer. Next, a photoresist is patterned on the polysilicon layer, covering a portion of the top surface of the polysilicon layer to define a gate electrode region. An etching process is performed using the photoresist as an etching mask. The unmasked portions of the gate oxide layer and the polysilicon layer are etched to the surface of the substrate to form a gate electrode. After the photoresist is removed, a dielectric layer is formed on the gate electrode and the substrate. Sidewall spacers are formed on the sidewalls of the gate electrode by an anisotropic etching process to etch the dielectric layer. Afterwards, a phosphoric silicate glass (PSG) is formed on the gate electrode and the substrate by a chemical vapor deposition process. Next, the phosphorous (P) ions of the phosphoric silicate glass (PSG) are diffused and driven into the substrate by an annealing thermal treatment process to form source/drain regions. Afterwards, a thermal oxide layer is formed on the gate electrode and the substrate by a thermal oxidation process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the structure and method of the present invention. The preferred embodiment structure will be described first along with a description of modifications. A preferred method forming the structure will then be described.

Figure 1A:
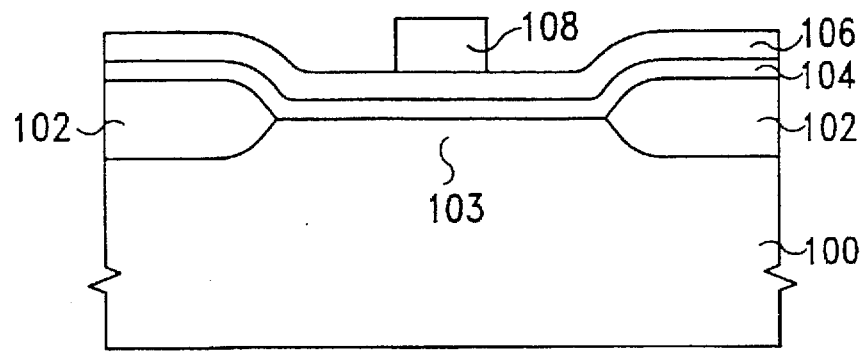
FIG. 1A to FIG. 1E are cross-sectional views of a semiconductor wafer illustrating the steps of forming the source/drain regions by using an ion implanation process, according to the first conventional method.
Figure 1B:
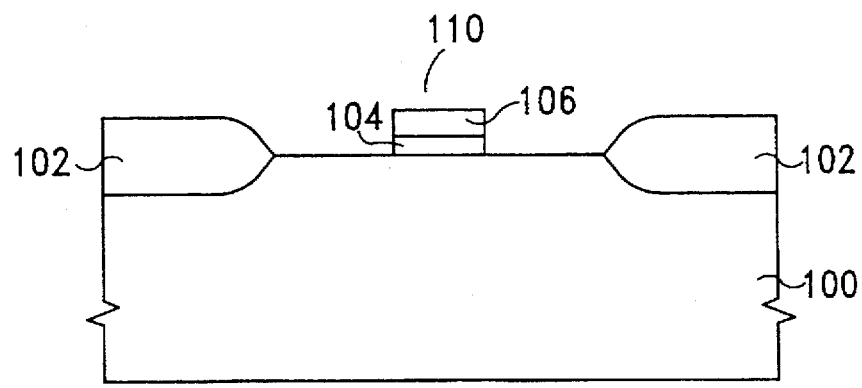
Figure 1C:
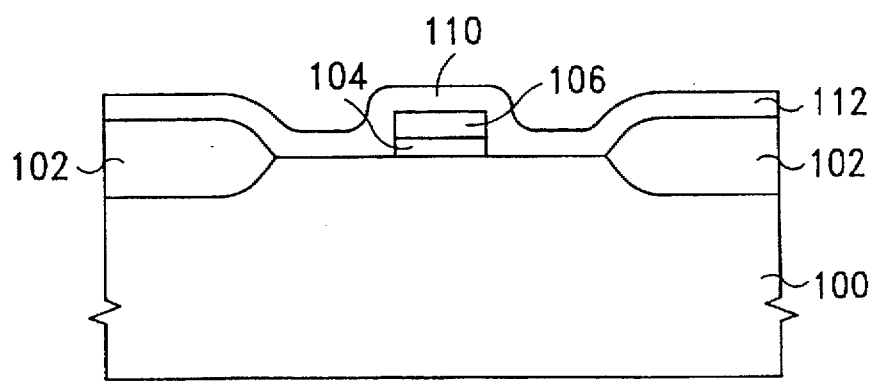
Figure 1D:
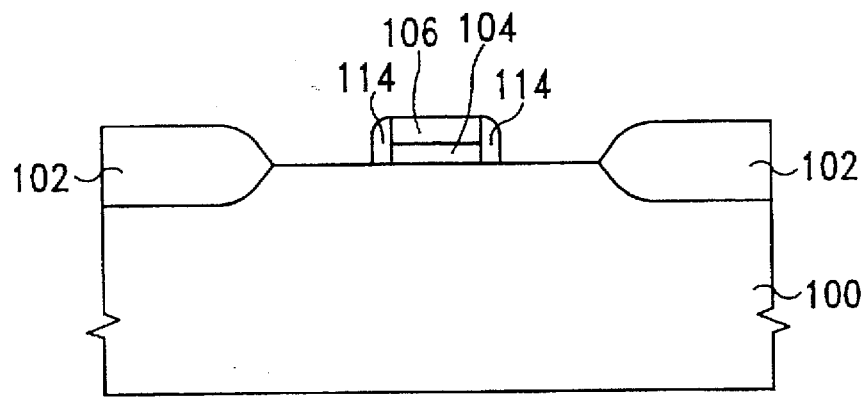
Figure 1E:
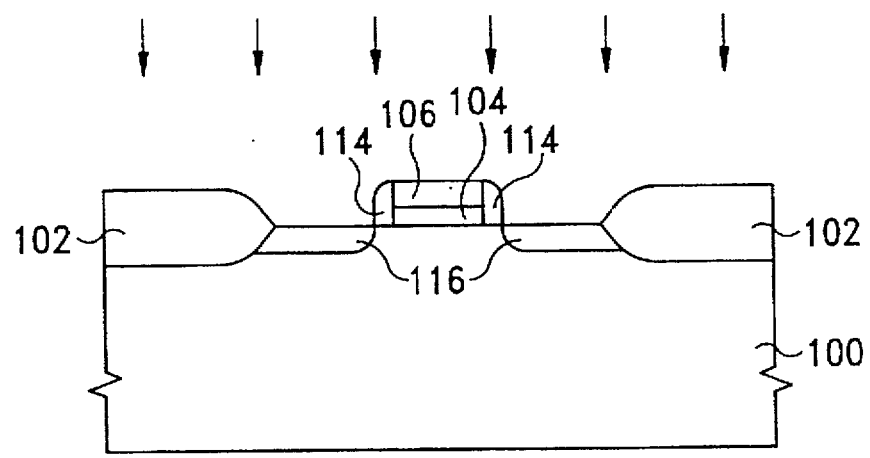
Figure 2A:
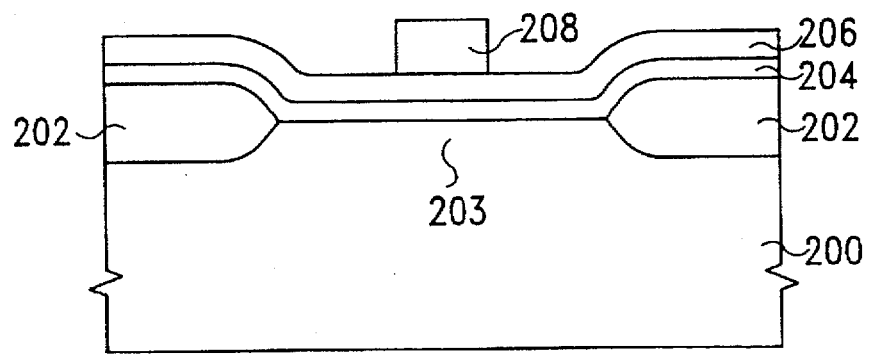
FIG. 2A to FIG. 2E are cross-sectional views of a semiconductor wafer illustrating the steps of forming the source/drain regions by using a phosphoric silicate glass (PSG) as a diffusion source, according to another conventional method.
Figure 2B:
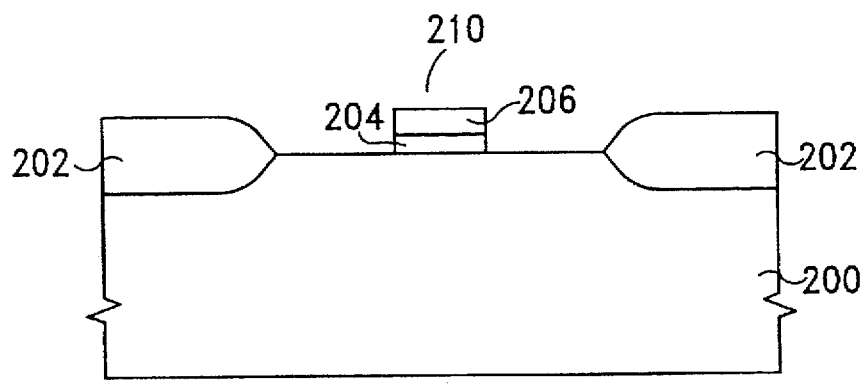
Figure 2C:
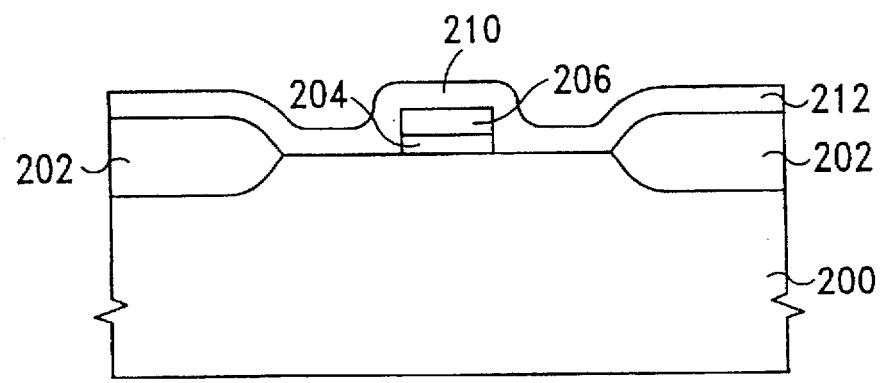
Figure 2D:
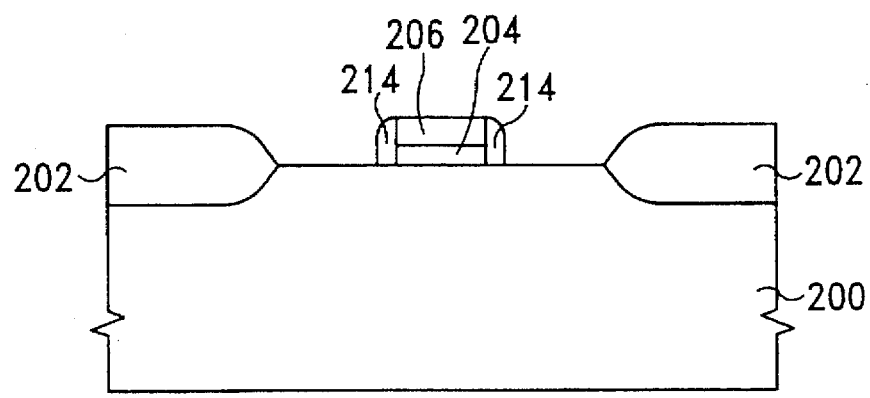
Figure 2E:
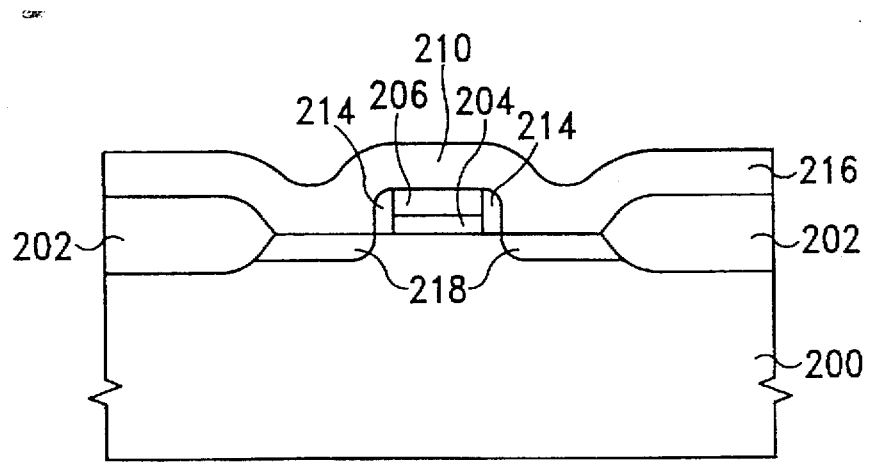
Figure 3A:
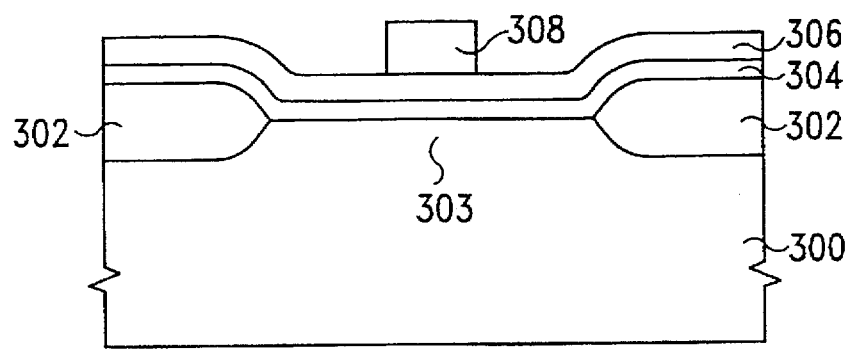
FIG. 3A to FIG. 3E are cross-sectional views of a semiconductor wafer illustrating the steps of forming the source/drain regions by using a phosphoric silicate glass (PSG) as a diffusion source, according to the first prefer embodiment of the present invention.

Referring to FIG. 3A, an isolation process such as a well known LOCOS (Local Oxidation of Silicon process) is performed, and then field oxide layers 42 is formed on a substrate 300 to define an active area 303. A gate oxide layer 304 is formed on the substrate 300 by a thermal oxidation process. The thickness of the gate oxide layer 304 can range from about 40 to 200 angstroms. A polysilicon layer 306 is formed on the gate oxide layer 304 to have a thickness about 500 to 3000 angstroms by a conventional chemical vapor deposition process. Next, a photoresist 308 is patterned on the polysilicon layer 306, covering a portion of the top surface of the polysilicon layer 306 to define a gate electrode region.

Figure 3B:
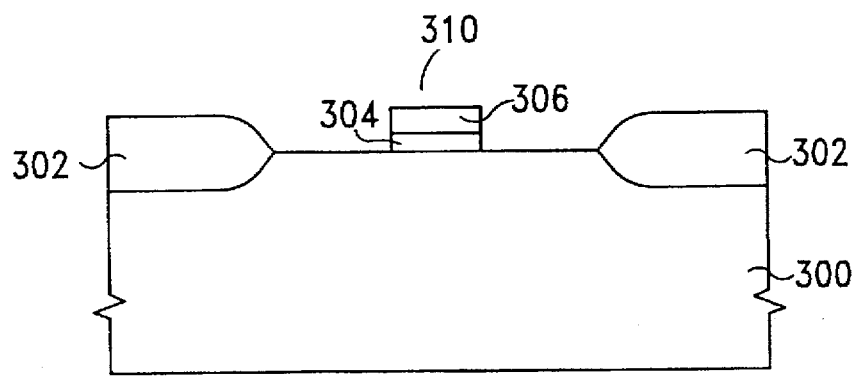

Referring to FIG. 3B, an etching process is performed by using the photoresist 308 as an etching mask. The unmasked portions of the gate oxide layer 304 and the polysilicon layer 306 are etched to the surface of the substrate 300 to form a gate electrode 310. Next, the photoresist 308 is stripped away.

Figure 3C:
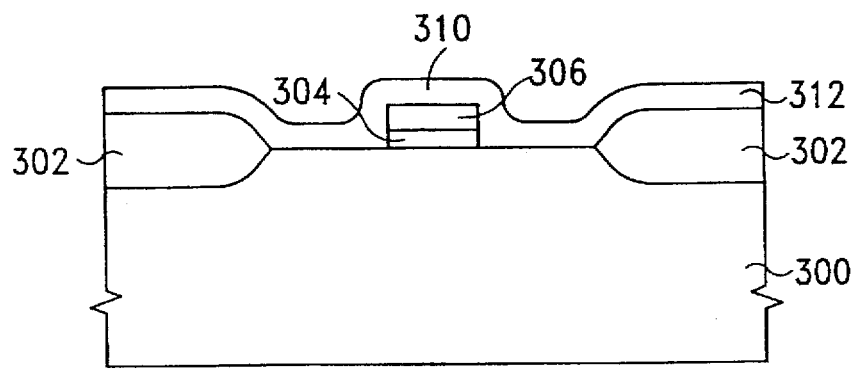

Afterwards, referring to FIG. 3C, a dielectric layer 312 is formed on the gate electrode 310 and the substrate 300. The dielectric layer 312 is consisted of a phosphoric silicate glass (PSG) or silicon nitride deposited using a chemical vapor deposition process. The thickness of the dielectric layer 312 can range from about 1000 to 3000 angstroms.

Figure 3D:
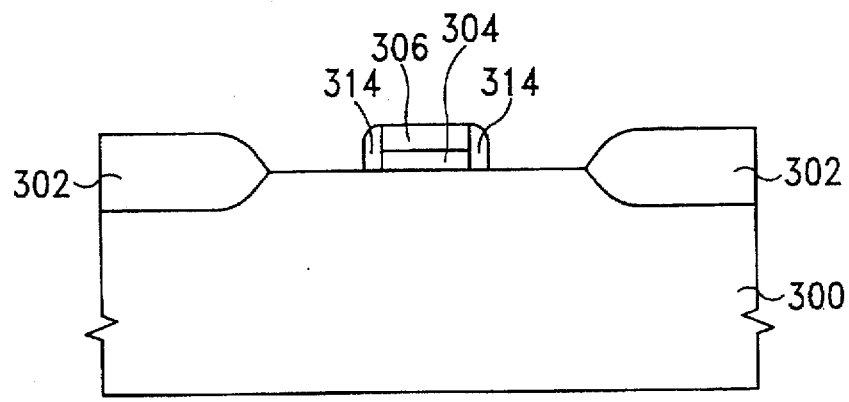

Next, as shown in FIG. 3D, an anisotropic etching process, such as a reactive ion etch, is performed to etch the dielectric layer 312, forming sidewall spacers 314 on the sidewalls of the gate electrode 310.

Figure 3E:
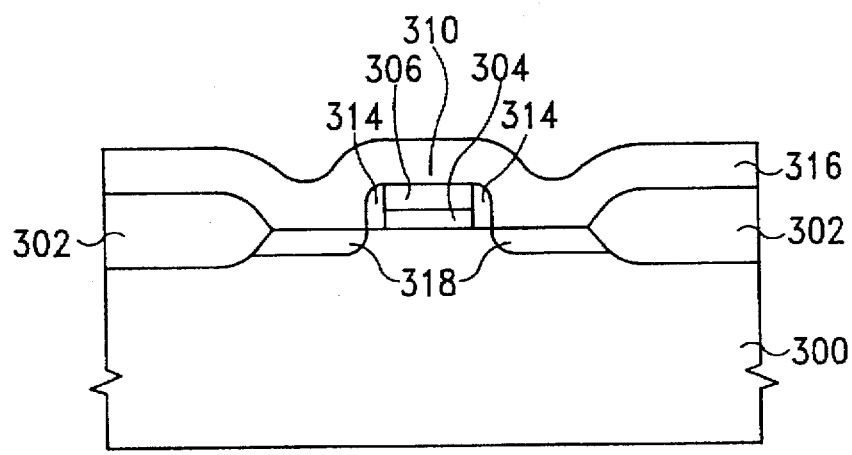

Referring to FIG. 3E, a phosphoric silicate glass (PSG) 316 is formed on the gate electrode 310 and the substrate 300 by using a chemical vapor deposition process. The thickness of the phosphoric silicate glass (PSG) 316 is about 200 to 2000 angstroms. Afterwards, a thermal treatment process, such as a rapid thermal annealing or a furnace annealing, is performed at the temperature of 800° C. to 1100° C. The time of the thermal treatment process is between 5 seconds to 1 hour. The phosphorous (P) ions in the phosphoric silicate glass (PSG) 316 are diffused and driven into the substrate 300 to form the source/drain regions 318. The impurity concentration of the source/drain regions 318 is about $10^{18}$ atoms/cm$^3$ to $10^{20}$ atoms/cm$^3$.

Figure 3F:
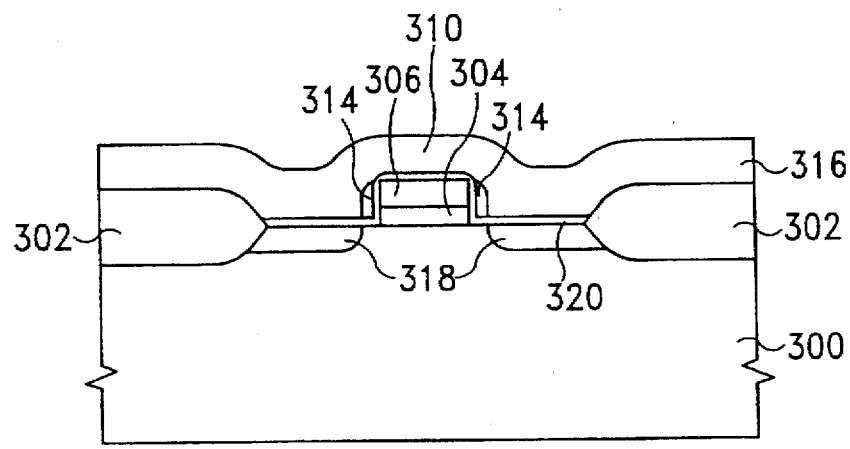
FIG. 3F is a cross-sectional view of a semiconductor wafer illustrating the step of forming a thermal oxide layer by the thermal oxide process after the flow of FIG. 3E, according to the first prefer embodiment of the present invention.

Referring to FIG. 3F, a thermal oxide layer 320 is formed on the gate electrode 310 and the substrate 300 using a dry thermal oxidation process at the temperature of between about 700° C. to 1000° C. The time of the dry thermal oxidation process is about 5 seconds to 1 hour. The thickness of the thermal oxide layer 320 can range from about 50 to 200 angstroms. The thermal oxide layer 320 serves as the barrier layer to prevent ions from diffusing into the substrate 300 during the subsequent thermal treatment process. Therefore, in one embodiment of the present invention, the method can reduce the damage of the dynamic random access memory device. Additionally, the rapid thermal annealing process and the dry thermal oxidation process are performed in the same furnace in the present invention. A nitrogen gas is inserted into the furnace first to perform the thermal annealing process, diffusing ions into the substrate. Next, the nitrogen gas is closed. An oxygen gas is inserted into the same furnace to perform the dry thermal oxidation process, forming the thermal oxide layer. Afterwards, the oxygen gas is drawn out. The nitrogen gas is inserted into the furnace again to perform the subsequent process. In the present invention, the overall thermal treatment processes, which include the thermal annealing process and the dry thermal oxidation process, can be performed in the same furnace. Therefore, it is very simple and convenient to perform a fabrication of DRAM cell.

Figure 3G:
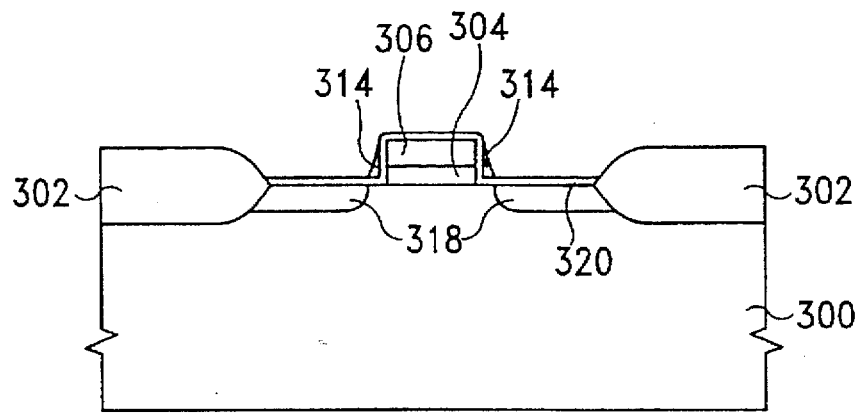
FIG. 3G is a cross-sectional view of a semiconductor wafer illustrating the step of removing the PSG by a wet etching process after the flow of FIG. 3F, according to the first prefer embodiment of the present invention.

In the fabrication of a dynamic random access memory (DRAM) cell, MOS transistors formed in memory cell usually have the character of a low damage and a low impurity concentration. Alternatively, MOS transistors formed in periphery circuit usually have the character of a high impurity concentration and disregarding leakage current to perform the driving and retrieving operation at a high speed. Accordingly, there are two convert process orders in the fabrication of damage-free doping for forming a dynamic random access memory cell in the present invention. One method is that MOS transistors are formed in memory cell first, and MOS transistors are formed in periphery circuit later. Another method changes the process order of foming MOS transistors. MOS transistors are formed in periphery circuit first, and MOS transistors are formed in memory cell later. According to the different process order of forming MOS transistors in the periphery circuit or memory cell, the different processes are described as follow:

(1) If MOS transistors is formed in memory cell first. The phosphoric silicate glass (PSG) must be removed so that MOS transistors can be formed in periphery circuit by using a heavily doped process. Referring to FIG. 3F, the thermal oxide layer 320 is formed on the substrate 300 and the gate electrode 310. Afterwards, referring to FIG. 3G, the phosphoric silicate glass (PSG) 316 is removed by a wet etching process using a 1% hot hydrofluoric acid solution. The wet etching process has a high etching selectivity between phosphoric silicate glass (PSG) and oxide (i.e., a selectivity ratio of the etching process about 100-to-1). Therefore, it is very easy to control the removal of the phosphoric silicate glass (PSG) 316.

Figure 4A:
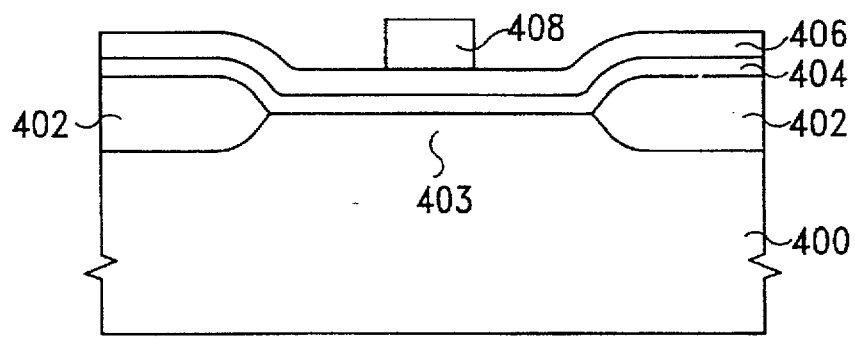
FIG. 4A to FIG. 4E are cross-sectional views of a semiconductor wafer illustrating the steps of forming the source/drain regions by using a phosphoric silicate glass (PSG) as a diffusion source, according to the second prefer embodiment of the present invention.
Figure 4B:
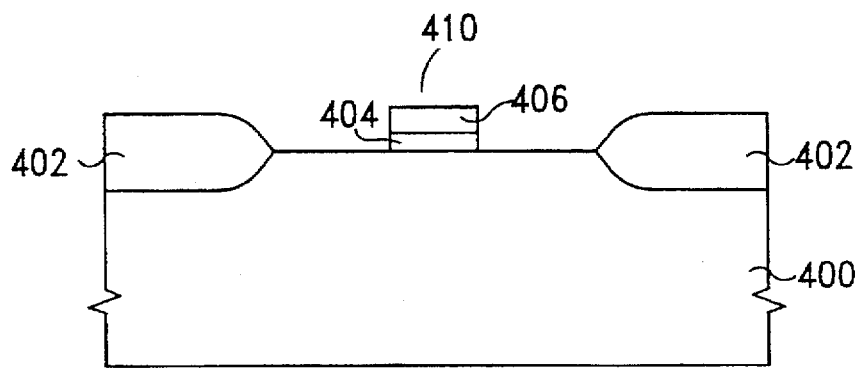
Figure 4C:
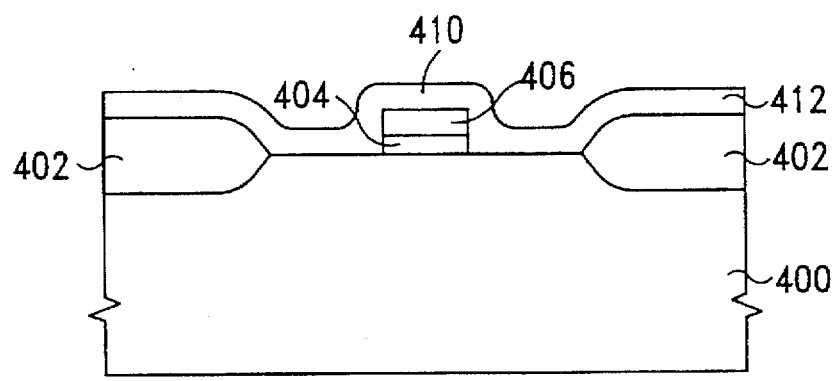
Figure 4D:
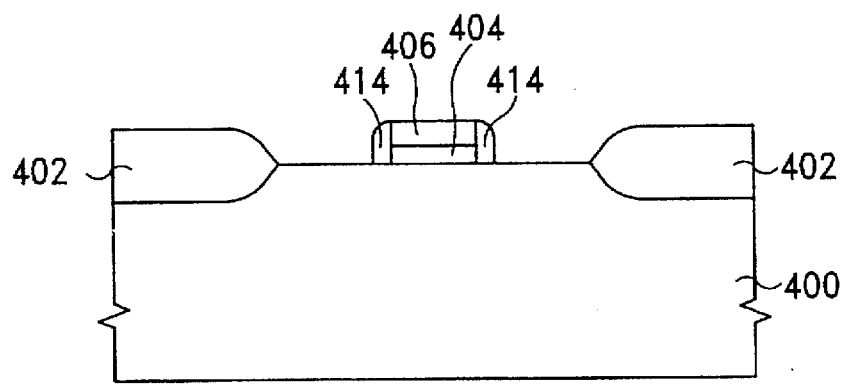
Figure 4E:
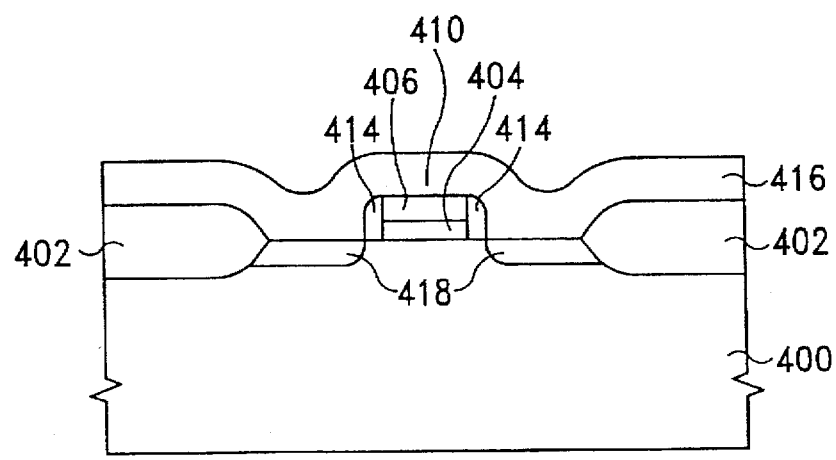
Figure 4F:
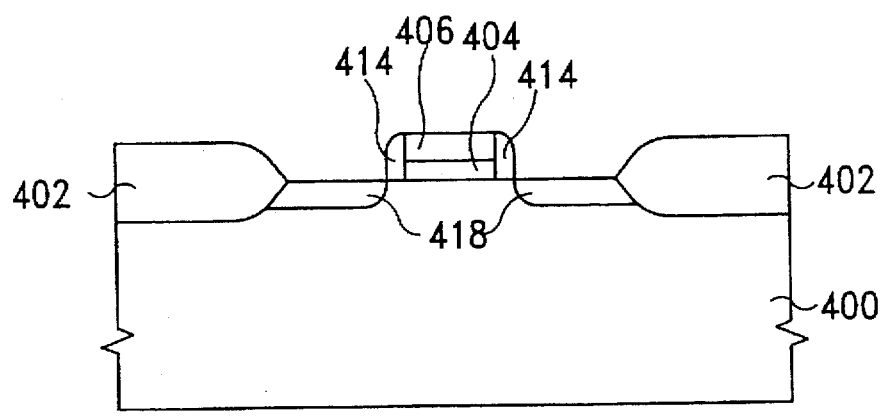
FIG. 4F is a cross-sectional view of a semiconductor wafer illustrating the step of removing the PSG by a dry etching process after the flow of FIG. 4E, according to the second prefer embodiment of the present invention.
Figure 4G:
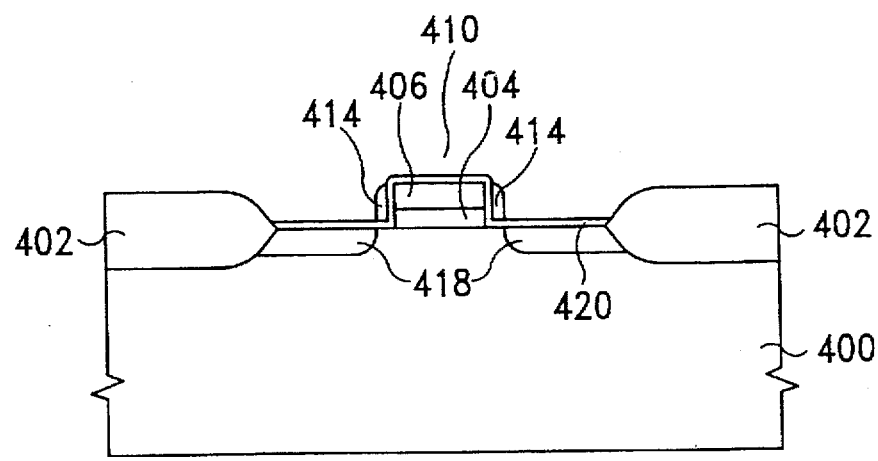
FIG. 4G is a cross-sectional view of a semiconductor wafer illustrating the step of forming a thermal oxide layer by a thermal oxide process after the flow of FIG. 4F, according to the second prefer embodiment of the present invention.

Additionally, in another prefer embodiment of the present invention, the phosphoric silicate glass (PSG) is removed first by a dry etching process. Next, a thermal oxide layer is formed by a thermal oxidation process. Referring to FIG. 4A to FIG. 4E, they show cross-sectional views of a semiconductor wafer illustrating the steps of forming the source/ drain regions by using a phosphoric silicate glass (PSG) as a diffusion source. After an isolation process such as LOCOS, field oxide layers 402 are formed on a substrate 400 to define an active area 403. Next, a gate oxide layer 404 and a polysilicon layer 406 are sequentially deposited over the substrate 400. A photoresist 408 is patterned on the polysilicon layer 406 to define a gate electrode region. Next, portions of the gate oxide layer 404 and the polysilicon layer 406 are etched using the photoresist 408 as an etching mask. Then a gate electrode 410 is formed. After removing the photoresist 408, a dielectric layer 412 is formed on the gate electrode 410 and the substrate 400. An anisotropic etching process, such as a reactive ion etch, is performed to etch the dielectric layer 412, forming sidewall spacers 414 on the sidewalls of the gate electrode 410. A phosphoric silicate glass (PSG) 416 is formed on the gate electrode 410 and the substrate 400 by a chemical vapor deposition process. Thereafter, a thermal treatment process is performed. The phosphorous (P) ions of the phosphoric silicate glass (PSG) 416 are diffused and driven into the substrate 400 to form source/drain regions 418. Afterwards, referring to FIG. 4F, the phosphoric silicate glass (PSG) 416 is removed by a dry etching process after forming the source/drain regions 418. Next, referring to FIG. 4G, a thermal oxide layer 420 is formed on the substrate 400 and the gate electrode 410 by a thermal oxidation process. The thermal oxide layer 420 can prevent ions from diffusing into the substrate 400 during the subsequent thermal process.

(2) If MOS transistors is formed in periphery circuit first. The phosphoric silicate glass (PSG) can be maintained as a planarization, as shown in FIG. 3F. Thereafter, the fabrication of dynamic random access memory can be subsequently performed.

Accordingly, in the present invention, the method of damage-free doping for forming a dynamic random access memory cell uses the phosphoric silicate glass (PSG) as a diffusion source. The phosphorous (P) ions of the phosphoric silicate glass (PSG) are diffused into the substrate by high temperature during the thermal annealing process. Afterwards, the thermal oxide layer is formed on the surface of the substrate and the gate electrode by the thermal oxidation process. The thermal oxide layer can prevent ions from diffusing into the substrate so that the method can reduce the subthreshold and isolation leakages of the dynamic random access memory device. The phosphoric silicate glass (PSG) serving as a diffusion source has better control of diffusion depth and diffusion concentration. Therefore, the leakage current will be reduced.

Although specific embodiments including the preferred embodiment have been illustrated and described, it will be obvious to those skilled in the art that various modifications may be made without departing from the spirit and scope of the present invention, which is intended to be limited solely by the appended claims.

What is claimed is:

1. A method of forming a dynamic random access memory comprising the steps of:

forming a field oxide layer to define an active area;

forming a gate oxide layer on a substrate;

forming a polysilicon layer on said gate oxide layer;

forming a photoresist layer on said polysilicon layer to define a gate electrode region;

removing a portion of said polysilicon layer and said gate oxide layer using said photoresist as an etching mask to form a gate electrode;

removing said photpresist layer;

forming a dielectric layer on said gate electrode and said substrate;

anisotropic etching said dielectric layer to form sidewall spacers on the sidewalls of said dielectric layer;

forming a phosphoric silicate glass on said gate electrode and said substrate;

performing an annealing process to form a source and a drain regions by the phosphorous ions of said phosphoric silicate glass diffusing into said substrate; and performing thermal oxidation process to form a thermal oxide layer on said substrate and said gate electrode.

2. The method of claim 1, wherein said field oxide is formed to define said active area using the Local Oxidation of Silicon process.

3. The method of claim 1, wherein said gate oxide layer is formed to have a thickens in a range of about 40 to 200 angstroms.

4. The method of claim 1, wherein a thickness of said polysilicon layer is in a range of about 500 to 3000 angstroms.

5. The method of claim 1, wherein said dielectric layer is formed to have a thickens in a range of about 1000 to 3000 angstroms.

6. The method of claim 1, wherein said dielectric layer is phosphoric silicate glass formed by a chemical vapor deposition.

7. The method of claim 1, wherein said dielectric layer is silicon nitride formed by a chemical vapor deposition.

8. The method of claim 1, wherein said phosphoric silicate glass layer is formed by a chemical vapor deposition.

9. The method of claim 1, wherein said phosphoric silicate glass layer is in a range of about 200 to 2000 angstroms.

10. The method of claim 1, wherein the temperature to form said source and a drain regions is about 800° C. to 1100° C., the time of performing said annealing process being about 5 seconds to 1 hour.

11. The method of claim 1, wherein the impurity concentration of said source and a drain regions is about $10^{18}$ atoms/cm$^3$ to $10^{20}$ atoms/cm$^3$.

12. The method of claim 1, wherein said thermal oxide layer is form by using a dry thermal oxidation process.

13. The method of claim 1, wherein the thickness of said thermal oxide layer is in a range of about 50 to 200 angstroms.

14. The method of claim 1, further comprising the steps after said source and said drain regions being formed:

removing said phosphoric silicate glass layer by a dry etching process;

performing a heavily doped process to MOS transistors of a periphery circuit in said dynamic random access memory.

15. The method of claim 1, further comprising the steps after said thermal oxide layer being formed:

removing said phosphoric silicate glass layer by a wet etching process using 1% hydrofluoric acid solution;

performing a heavily doped process to MOS transistors of a periphery circuit in said dynamic random access memory.

16. A method of forming a dynamic random access memory comprising the steps of:

forming a field oxide layer to define an active area;

forming a gate oxide layer on a substrate;

forming a polysilicon layer on said gate oxide layer;

forming a photoresist layer on said polysilicon layer to define a gate electrode region;

removing a portion of said polysilicon layer and said gate oxide layer using said photoresist as an etching mask to form a gate electrode;

removing said photpresist layer;

forming a dielectric layer on said gate electrode and said substrate;

anisotropic etching said dielectric layer to form sidewall spacers on the sidewalls of said dielectric layer;

forming a phosphoric silicate glass on said gate electrode and said substrate, the thickness of said phosphoric silicate glass being in a range of about 200 to 2000 angstroms;

performing an annealing process to form a source and a drain regions by the phosphorous ions of said phosphoric silicate glass diffusing into said substrate, the temperature of said annealing process being about 800° C. to 110° C., the time of said annealing process being about 5 seconds to 1 hour;

performing a dry thermal oxidation process to form a thermal oxide layer on said substrate and said gate electrode, the thickness of said thermal oxide layer being in a range of about 50 to 200 angstroms;

removing said phosphoric silicate glass layer by a wet etching process using 1% hydrofluoric acid solution; and performing a heavily doped process to MOS transistors of a periphery circuit in said dynamic random access memory.

17. The method of claim 16, wherein the impurity concentration of said source and a drain regions is about $10^{18}$ atoms/cm$^3$ to $10^{20}$ atoms/cm$^3$.

18. A method of forming a dynamic random access memory comprising the steps of:

forming a field oxide layer to define an active area;

forming a gate oxide layer on a substrate;

forming a polysilicon layer on said gate oxide layer;

forming a photoresist layer on said polysilicon layer to define a gate electrode region;

removing a portion of said polysilicon layer and said gate oxide layer using said photoresist as an etching mask to form a gate electrode;

removing said photpresist layer;

forming a dielectric layer on said gate electrode and said substrate;

anisotropic etching said dielectric layer to form sidewall spacers on the sidewalls of said dielectric layer;

forming a phosphoric silicate glass on said gate electrode and said substrate, the thickness of said phosphoric silicate glass being in a range of about 200 to 2000 angstroms;

performing an annealing process to form a source and a drain regions by the phosphorous ions of said phosphoric silicate glass diffusing into said substrate, the temperature of said annealing process being about 800° C. to 110° C., the time of said annealing process being about 5 seconds to 1 hour;

removing said phosphoric silicate glass layer by a dry etching process;

performing a heavily doped process to MOS transistors of a periphery circuit in said dynamic random access memory; and performing a dry thermal oxidation process to form a thermal oxide layer on said substrate and said gate electrode, the thickness of said thermal oxide layer being in a range of about 50 to 200 angstroms.

19. The method of claim 18, wherein the impurity concentration of said source and a drain regions is about $10^{18}$ atoms/cm$^3$ to $10^{20}$ atoms/cm$^3$.

* * * * *